(12) United States Patent
Hartung et al.

(10) Patent No.: US 9,391,252 B2
(45) Date of Patent: Jul. 12, 2016

(54) OPTOELECTRONIC COMPONENT

(71) Applicant: OSRAM Opto Semiconductors GmbH, Regensburg (DE)

(72) Inventors: Georg Hartung, Regenstauf (DE); Marcus Zenger, Herrnwahlthann (DE); Barbara Behr, Sinzing (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/524,914

(22) Filed: Oct. 27, 2014

(65) Prior Publication Data

US 2015/0115305 A1   Apr. 30, 2015

(30) Foreign Application Priority Data

Oct. 29, 2013   (DE) .......................... 10 2013 111 918

(51) Int. Cl.
| | |
|---|---|
| *H01L 33/62* | (2010.01) |
| *H01L 33/48* | (2010.01) |
| *H01L 33/60* | (2010.01) |
| *H01L 33/38* | (2010.01) |
| *H01L 33/44* | (2010.01) |

(52) U.S. Cl.
CPC .............. *H01L 33/62* (2013.01); *H01L 33/382* (2013.01); *H01L 33/44* (2013.01); *H01L 33/486* (2013.01); *H01L 33/60* (2013.01)

(58) Field of Classification Search
CPC ....... H01L 33/62; H01L 33/382; H01L 33/44; H01L 33/486; H01L 33/60
See application file for complete search history.

(56) References Cited

U.S. PATENT DOCUMENTS

| 2004/0089939 | A1* | 5/2004 | Ogihara et al. ................ 257/690 |
| 2012/0043575 | A1* | 2/2012 | Kim et al. ......................... 257/98 |
| 2012/0168809 | A1* | 7/2012 | Maute et al. ..................... 257/99 |
| 2012/0299046 | A1* | 11/2012 | Itonaga ............................. 257/99 |
| 2013/0062640 | A1* | 3/2013 | Yen et al. ......................... 257/98 |
| 2013/0187192 | A1* | 7/2013 | Hoeppel ........... H01L 31/02005 257/99 |

FOREIGN PATENT DOCUMENTS

| DE | 10 2007 022 947 A1 | 10/2008 |
| DE | 10 2008 062 933 A1 | 7/2010 |
| DE | 10 2010 025 320 A1 | 12/2011 |

* cited by examiner

*Primary Examiner* — Michelle Mandala
(74) *Attorney, Agent, or Firm* — McDermott Will & Emery LLP (57) ABSTRACT

An optoelectronic component comprising a semiconductor body, a first connection layer, an insulation layer and a second connection layer, wherein the semiconductor body has an active region for generating electromagnetic radiation and the second connection layer comprises a first partial layer and a second partial layer is specified, wherein
the insulation layer electrically insulates the first connection layer from the second connection layer,
the first partial layer is arranged between the second partial layer and the semiconductor body in a vertical direction,
in a plan view of the semiconductor body the first connection layer overlaps the first partial layer and is spaced apart from the second partial layer in a lateral direction, and
the first connection layer has a first layer thickness and the second partial layer has a second layer thickness, wherein the first layer thickness and the second layer thickness differ from one another at most by 20%.

20 Claims, 2 Drawing Sheets

OPTOELECTRONIC COMPONENT

The present application relates to an optoelectronic component.

A light-emitting semiconductor body is often connected to a carrier by means of a soldering layer, wherein the soldering layer often comprises gold or platinum on account of its good filling properties with regard to height differences on a soldering surface. However, the use of such soldering materials is associated with high production costs. Other soldering metals offer a more expedient alternative with respect thereto, but exhibit a poorer filling in comparison with gold or platinum under the same soldering conditions.

One object is to specify an optoelectronic component which can be produced in a simplified and cost-effective manner.

This object is achieved by means of an optoelectronic component according to the independent patent claim. The dependent patent claims relate to further configurations and developments.

In accordance with at least one embodiment, the optoelectronic component comprises a semiconductor body. The semiconductor body comprises, in particular, an active region for generating electromagnetic radiation, a first semiconductor layer and a second semiconductor layer. The active region is arranged between the first semiconductor layer and the second semiconductor layer. The semiconductor body has a first main surface and a second main surface facing away from the first main surface. In particular, the first main surface and the second main surface delimit the semiconductor body. In particular, only semiconductor layers are arranged between the first main surface and the second main surface.

In accordance with at least one embodiment, the optoelectronic component comprises a first connection layer and a second connection layer. The first connection layer is provided for example for homogeneously injecting current into the second semiconductor layer. The second connection layer is provided for example for homogeneously injecting current into the first semiconductor layer. In particular, the second connection layer and the first connection layer form an ohmic contact.

In particular, the first connection layer is subdivided into a plurality of sections. The sections are spaced apart from one another spatially in a lateral direction, for example. A lateral direction is understood to mean a direction which is directed parallel to a main extension plane of the semiconductor body. By way of example, the second connection layer is embodied in a continuous fashion. In particular, the second connection layer comprises a first partial layer and a second partial layer. The first partial layer is arranged for example between the semiconductor body and the second partial layer.

In accordance with at least one embodiment, the component comprises an insulation layer. In particular, the first connection layer is electrically insulated from the second connection layer by the insulation layer. The first connection layer is arranged on the insulation layer, for example, such that the insulation layer is arranged at least regionally between the first connection layer and the semiconductor body. By way of example, the insulation layer is embodied in a continuous fashion. For example, the sections of the first connection layer are spatially separated from the second connection layer in each case by the insulation layer in the lateral direction.

In at least one embodiment, the component comprises a semiconductor body, a first connection layer, an insulation layer and a second connection layer. The semiconductor body has an active region for generating electromagnetic radiation. Furthermore, the second connection layer comprises a first partial layer and a second partial layer. The first connection layer is electrically insulated from the second connection layer by the insulation layer. The first partial layer is arranged between the second partial layer and the semiconductor body in a vertical direction. In a plan view of the semiconductor body the first connection layer regionally overlaps the first partial layer and is spaced apart from the second partial layer in a lateral direction. Furthermore, the first connection layer has a first layer thickness. The second partial layer has a second layer thickness. The first layer thickness and the second layer thickness differ from one another at most by 20%.

The first layer thickness and the second layer thickness are thus approximately identical. The first connection layer and the insulation layer can be fashioned such that they each have a maximum vertical elevation from the second main surface of the semiconductor body, wherein the maximum elevation of the first connection layer and the maximum elevation of the insulation layer are at the same vertical level within the scope of the production tolerances. As a result, the differences with regard to the vertical elevations of the first connection layer and the insulation layer along a lateral direction are reduced, such that topographical differences on a connecting area can be minimized, wherein the connecting area is arranged, for instance, regionally between the first connection layer and a connecting layer and regionally between the insulation layer and the connecting layer. Consequently, it is possible to save connecting materials when forming the connecting layer.

A vertical direction is understood to mean a direction that is directed perpendicular to the main extension plane of the semiconductor body. In particular, the vertical direction is parallel to a growth direction of the semiconductor layers of the semiconductor body. In the context of the application, a layer has a substantially constant layer thickness if the layer has an identical vertical extent in particular within the scope of the production tolerances, apart from regions in which the layer is shaped over underlying edges.

In accordance with at least one embodiment, the component comprises a carrier. In particular, the component is a thin-film semiconductor chip. The component is free of a growth substrate, for example. The carrier of the component thus differs from a growth substrate on which the semiconductor layers are grown epitaxially.

In accordance with at least one embodiment of the component, the semiconductor body, the first connection layer and the insulation layer are mechanically stably connected to the carrier by means of a connecting layer. The connecting layer is arranged in particular regionally between the carrier and the insulation layer and regionally between the carrier and the first connection layer.

In accordance with at least one configurational variant, the connecting layer is embodied in a continuous fashion. In particular, the connecting layer only adjoins the carrier, the connection layer and the insulation layer.

In accordance with at least one embodiment of the component, the semiconductor body has at least one cutout. The at least one cutout extends in particular through the first semiconductor layer and the active region into the second semiconductor layer. A cutout is understood to mean an opening in the semiconductor body which is not formed all the way through the semiconductor body. In other words, the cutout forms a blind hole in the semiconductor body.

In accordance with at least one configurational variant, the insulation layer extends in the vertical direction partly into the at least one cutout. In particular, the insulation layer regionally adjoins the second semiconductor layer. In the lateral direction, the insulation layer is arranged regionally between the first connection layer and the second connection layer.

In accordance with at least one embodiment of the component, the semiconductor body has a plurality of cutouts. The cutouts here in each case extend through the first semiconductor layer and the active region into the second semiconductor layer. By way of example, a cutout is assigned to a corresponding section of the first connection layer. In a plan view of the semiconductor body the corresponding section of the first connection layer is completely enclosed for example by the second partial layer. In particular, the corresponding section and the second partial layer of the second connection layer are free of overlap.

In accordance with at least one configurational variant, the corresponding section completely covers the at least one cutout in a plan view of the semiconductor body. Outside the at least one cutout, the corresponding section regionally overlaps the first partial layer of the second connection layer. In particular, the corresponding section and the first partial layer have an overlap region that encloses the at least one cutout fully circumferentially.

In accordance with at least one embodiment of the component, the first connection layer regionally indirectly adjoins the insulation layer in the lateral direction. In particular, a trench is formed between the insulation layer and a section of the first connection layer. In a plan view of the semiconductor body the trench overlaps the first partial layer in particular completely. In particular, the trench at least in the region of the semiconductor body has no location which does not overlap the first partial layer. The trench and the second partial layer are in particular free of overlap. In a plan view of the semiconductor body the trench extends, in particular fully circumferentially, around that section of the first connection layer which covers the cutout.

In accordance with at least one configurational variant, the trench has a vertical depth, which is of the same magnitude as the first layer thickness of the first connection layer. That is to say that the section of the first connection layer forms for example an inner wall of the trench. The depth of the trench is at least 200 nm, for example. In particular, the depth of the trench is less than or equal to 700 nm. Such trenches, even with small cross sections, can readily be filled not only by gold- or platinum-based solders, but also, for example, by nickel-, tin- or indium-based solders. The use of such alternative soldering materials reduces the outlay on costs in the production of the optoelectronic components. The use of low-platinum, in particular platinum-free, solders, for example NiSn-based solders, fulfils in particular the prerequisites for plasma separation processes, which are more cost-effective in comparison with laser-based separation processes, for example. In particular, the low-current problems that often occur in the case of laser separation processes, for instance, can be avoided with the use of a plasma separation process.

In accordance with at least one embodiment of the component, the trench is filled with a connecting material of the connecting layer. Preferably, the trench is completely filled with the connecting material. A particularly stable connection between the carrier and the insulation layer and between the carrier and the first connection layer can be formed as a result. By way of example, the connecting layer is a solder layer containing nickel, tin or indium as soldering material. In particular, the connecting layer is low in platinum and gold. By way of example, a proportion by mass of platinum and gold in the connecting layer is at most 8%, in particular at most 5%, for instance at most 3%. Moreover, the connecting layer can be free of platinum and gold.

In accordance with at least one configurational variant, the second connection layer at least regionally adjoins the first main surface of the semiconductor body. In particular, the insulation layer adjoins the first main surface in places.

In accordance with at least one embodiment of the component, the electromagnetic radiation generated by the active region emerges from the optoelectronic component through the second main surface of the semiconductor body. In particular, the second main surface of the semiconductor body is embodied as a radiation exit surface of the optoelectronic component. Preferably, the second main surface of the semiconductor body is free of electrical contacts. The first connection layer and the second connection layer are in particular both arranged on a same side of the semiconductor body. In particular, the first main surface is arranged between the second main surface and the connection layers. Such a configuration of the optoelectronic component precludes the shading of the electromagnetic radiation by possible electrical contacts—arranged on the second main surface—of the first and second connection layers and thus increases the efficiency of the component. It is also conceivable for a radiation-transmissive, in particular transparent, protective layer to be arranged on the second main surface.

In accordance with at least one embodiment of the component, the second partial layer overlaps the first partial layer, in particular completely, in a plan view of the semiconductor body. That is to say that the second partial layer in particular in the region of the semiconductor body has no location which does not overlap the first partial layer. Laterally with respect to the semiconductor body, the first partial layer and the second partial layer can be free of overlap or be overlapped only regionally.

In accordance with at least one embodiment of the component, the first partial layer contains a region which overlaps neither the second partial layer nor the first connection layer. In a plan view of the semiconductor body this region free of overlap is arranged between the second partial layer and the first connection layer in the lateral direction. That is to say that in a plan view of the semiconductor body the first connection layer is spaced apart from the second partial layer laterally in particular by said region free of overlap.

In accordance with at least one embodiment of the component, the first partial layer is embodied as a mirror layer for the electromagnetic radiation generated by the active region. Furthermore, the first connection layer is embodied as a further mirror layer in particular for the electromagnetic radiation generated by the active region. In a plan view of the semiconductor body the first connection layer and the second partial layer jointly cover the semiconductor body preferably completely. That is to say, in particular, that the semiconductor body is covered regionally by the first connection layer and regionally by the second partial layer, wherein the semiconductor body has no location which is not covered by the first connection layer or by the second partial layer. As a result, the electromagnetic radiation generated by the active region is reflected back at the mirror layers in the direction of the radiation exit surface. Such a configuration of the first connection layer and of the first partial layer increases the efficiency of coupling out the emitted radiation from the component.

In accordance with at least one embodiment of the component, a contact element is arranged in the at least one cutout. The contact element adjoins in particular the second semiconductor layer of the semiconductor body. The contact element is arranged between the second semiconductor layer and the first connection layer. Preferably, the contact element has a vertical height having a magnitude such that the first connection layer arranged on the contact element has a maximum vertical elevation which, within the scope of the production tolerances, is of the same magnitude as the maximum vertical elevation of the insulation layer. In particular, the contact element projects beyond the first partial layer by a layer thickness of the insulation layer. Such a configuration of the contact element reduces the topology differences with regard to the height of the layers within and outside the cutout. This leads to a reduction of the consumption of the material used for producing the connecting layer.

In accordance with at least one embodiment of the component, the first connection layer is arranged regionally between the contact element and the connecting layer. The connecting layer is preferably embodied in an electrically conductive fashion. The second semiconductor layer of the semiconductor body is thus electrically connected to the carrier of the component in particular by means of the contact element, the first connection layer and the connecting layer. The carrier has a first contact layer in particular on a rear side facing away from the semiconductor body, by means of which first contact layer the component can be externally electrically contactable for example at the rear side.

In accordance with at least one embodiment of the component, the first layer thickness differs from the second layer thickness at most by 10%. Preferably, the first connection layer has a layer thickness less than or equal to that of the second partial layer. In other words, the first layer thickness is between 0.9 times the second layer thickness and the second layer thickness inclusive. Particularly preferably, the first layer thickness differs from the second layer thickness at most by 3%. The layer thickness of the insulation layer is substantially constant. The first connection layer can be fashioned such that it does not project beyond the insulation layer in the vertical direction.

In accordance with at least one embodiment of the component, the first connection layer and the second partial layer have an identical layer thickness.

In accordance with at least one embodiment, the component comprises an edge region. The edge region is free of the semiconductor body, in particular. In the edge region, the component has a lateral opening, in particular. By way of example, the lateral opening is a depression of the component. In the lateral direction, the lateral opening only regionally adjoins the semiconductor body. The lateral opening has a bottom surface. In particular, the bottom surface is free of the semiconductor body. In other words, the opening does not adjoin the semiconductor body at the bottom surface. In particular, in the edge region, the second connection layer, the insulation layer and the first connection layer are arranged between the bottom surface of the opening and the carrier. In particular, the bottom surface of the opening is formed regionally by the insulation layer. By way of example, the bottom surface is formed regionally by the second partial layer. Preferably, the first connection layer and the second partial layer have a substantially identical layer thickness in the edge region of the component. Substantially identical means that the layer thicknesses are identical within the scope of the production tolerances. The layer thicknesses of the first connection layer and of the second partial layer can differ from one another for instance at most by 20%, preferably at most by 10%, and particularly preferably at most by 5%. Such a configuration reduces the layer thickness of the connecting layer in the edge region, as a result of which the consumption of a material used for producing the connecting layer is reduced.

In accordance with at least one embodiment, electrical contact can be made with the component externally in the edge region by means of the second partial layer. In particular, the optoelectronic component is electrically connected to an external current source during operation by means of the first contact layer, which is arranged on a rear side of the carrier, for example, and the second partial layer in the edge region, for instance in the opening. It is also conceivable for the second contact layer of the component to be applied at least regionally to the second partial layer exposed in the opening.

In accordance with at least one embodiment of the component, the insulation layer, the first connection layer, the first partial layer and the second partial layer have in particular in each case a substantially constant layer thickness. These layers can be applied by means of a coating method such as a PVD method (Physical Vapor Deposition), for instance sputtering, or a CVD method (Chemical Vapor Deposition), for instance vapor deposition or gas phase deposition.

BRIEF DESCRIPTION OF THE DRAWINGS

Further preferred embodiments and developments of the optoelectronic component are evident from the exemplary embodiments explained below in association with FIGS. 1 to 3, in which.

DETAILED DESCRIPTION

Elements that are identical, of identical type or act identically are provided with identical reference signs in the figures. The figures are in each case schematic illustrations and therefore not necessarily true to scale. Rather, comparatively small elements and in particular layer thicknesses for example at step transitions of the layers may be illustrated with an exaggerated size for clarification purposes.

Figure 1:
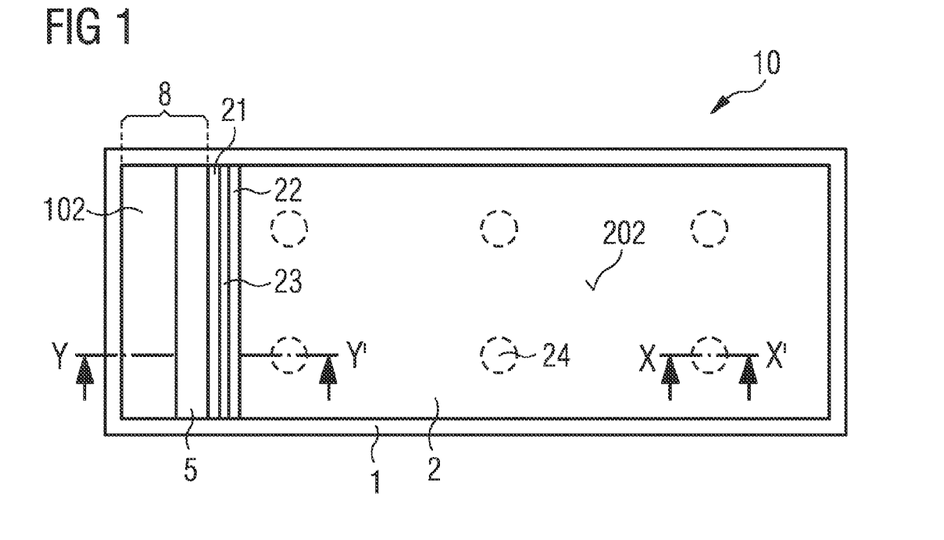
FIG. 1 shows one exemplary embodiment of an optoelectronic component in plan view.

One exemplary embodiment of an optoelectronic component is illustrated schematically in plan view in FIG. 1.

The optoelectronic component 10 comprises a semiconductor body 2 arranged on a carrier 1. The semiconductor body 2 is formed in particular by semiconductor layers deposited by means of an epitaxy process. The carrier 1 in particular differs from a growth substrate on which semiconductor layers of the semiconductor body are grown. The carrier 1 has a larger basic area than the semiconductor body 2. The carrier 1 completely covers the semiconductor body 2. The semiconductor body 2 contains an active region 23 for generating electromagnetic radiation. During the operation of the component, the emitted radiation emerges from the optoelectronic component through a second main surface 202 of the semiconductor body, said second main surface being embodied for example as a radiation exit surface.

The semiconductor body 2 has a plurality of cutouts 24 on its side facing away from the second main surface. In a vertical direction, the cutouts 24 extend in each case through a first semiconductor layer 21 and the active region 23 into a second semiconductor layer 22 of the semiconductor body 2 (not illustrated in FIG. 1). A respective section 40 of a first connection layer 4 is arranged in the cutouts 24, wherein the sections 40 of the first connection layer 4 are in electrical contact with the second semiconductor layer 22 of the semiconductor body 2. The cutouts 24 are arranged such that the injection of current into the second semiconductor layer 22 of the semiconductor body 2 is configured as homogeneously as possible.

The component comprises an edge region 8, which is free of the semiconductor body. In the edge region 8, the component has a lateral opening. The lateral opening is a depression of the component, for example, said depression being formed during the singulation of the semiconductor bodies 2 along a mesa trench at the wafer level.

An insulation layer 5 and a second contact layer 102 are arranged at least regionally in the edge region 8. In plan view the insulation layer 5 is arranged in the edge region in a lateral direction between the semiconductor body 2 and the second contact layer 102. Electrical contact can be made with the second semiconductor layer 22 externally by means of the second contact layer 102.

The optoelectronic component comprises, on a rear side of the carrier, a first contact layer 101 for making electrical contact with the first semiconductor layer 21. The carrier is embodied in particular in an electrically conductive fashion. Electrical contact can be made with the component externally by means of the first contact layer 101 and the second contact layer 102, such that an electromagnetic radiation is generated in the active region 23 during the operation of the component.

Figure 2:
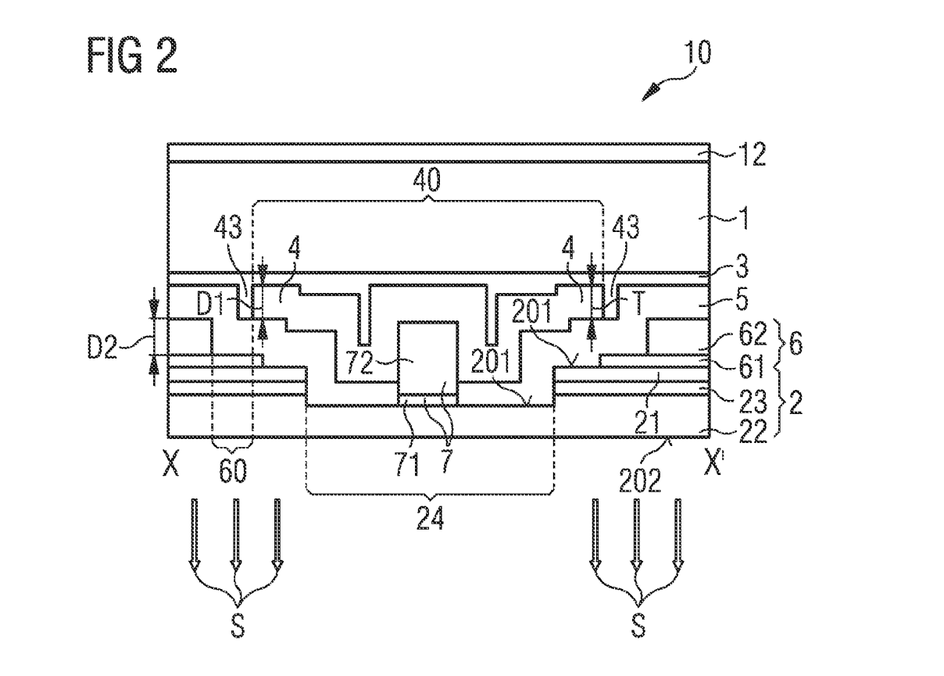
FIG. 2 shows an excerpt from an optoelectronic component in accordance with one exemplary embodiment in schematic sectional view.

FIG. 2 schematically illustrates an excerpt from an optoelectronic component in accordance with one exemplary embodiment in sectional view. In particular, a region identified by the line XX' illustrated in FIG. 1 is described.

The optoelectronic component 10 contains a semiconductor body 2, a first connection layer 4, a second connection layer 6 and a carrier 1. The semiconductor body has a second main surface 202 and a first main surface 201 facing away from the second main surface.

Both the first connection layer 4 and the second connection layer 6 are arranged between the semiconductor body 2 and the carrier 1. The second main surface 202 of the semiconductor body 2 is free of any electrical contacts. For insulation purposes, an insulation layer 5 is arranged between the first connection layer 4 and the second connection layer 6.

The semiconductor body 2, the first connection layer 4, the insulation layer 5 and the second connection layer 6 are mechanically stably connected to the carrier 1 by means of a connecting layer 3. The connecting layer 3 only adjoins the carrier 1, the first connection layer 4 and the insulation layer 5.

The semiconductor body 2 contains a first semiconductor layer 21 of a first charge type and a second semiconductor layer 22 of a second charge type. In particular, the second charge type is p-conducting and the first charge type is n-conducting, or vice versa. The active region 23 is arranged between the first semiconductor layer 21 and the second semiconductor layer 22. The first semiconductor layer 21 and the second semiconductor layer 22 can be embodied in each case in a single-layered or multilayered fashion. The active region 23 can be embodied in a single-layered or multilayered fashion. The active region 23 can have for example a conventional pn junction, a double hetero structure, a single quantum well structure or a multi quantum well structure.

The semiconductor body 2 has a cutout 24. The cutout 24 is formed on a side of the semiconductor body 2 which faces away from the second main surface 202. The cutout 24 extends through the first semiconductor layer 21 and the active region 23 into the second semiconductor layer 22.

The second connection layer 6 contains a first partial layer 61 and a second partial layer 62, wherein the first partial layer 61 is arranged between the semiconductor body 2 and the second partial layer 62. In this case, the first partial layer 61 adjoins the semiconductor body 2. The first partial layer 61 of the second connection layer 6 can be embodied as reflective for the radiation emitted by the active region 23. In particular, the first partial layer 61 contains a silver layer. The first partial layer 61 can be covered by a protective layer, for instance by a zinc oxide layer. The protective layer can be arranged between the second partial layer 62 and the first partial layer 61. In order to increase the conductivity, the protective layer can be n- or p-conductively doped. The second partial layer 62 can be embodied as a metal layer. The metal layer contains in particular gold, platinum or titanium.

The second connection layer 6 partly covers the semiconductor body 2 and has no overlap with the cutout 24 of the semiconductor body 2. In a plan view of the semiconductor body 2 the second partial layer 62 completely overlaps the first partial layer 61. The second partial layer 62 in particular in the region of the semiconductor body 2 has no location which does not overlap the first partial layer 61 in plan view.

For electrical insulation purposes, the insulation layer 5 is arranged regionally between the first connection layer 4 and the second connection layer 6. In the vertical direction, the insulation layer 5 extends regionally into the cutout 24. The insulation layer 5 regionally adjoins the second semiconductor layer 22 of the semiconductor body 2. By way of example, the insulation layer 5 contains silicon nitride or silicon oxide.

The first connection layer 4 is arranged on the insulation layer 5, such that the insulation layer 5 is arranged between the semiconductor body 2 and the first connection layer 4. In particular, the first connection layer 4 is deposited onto the insulation layer. In a plan view of the semiconductor body 2 the first connection layer 4 overlaps the first partial layer 61 of the second connection layer 6. In the lateral direction, the first connection layer 4 is spaced apart from the second partial layer 62 of the second connection layer 6.

The first partial layer 61 overlaps both the second partial layer 62 and the first connection layer 4, wherein the first partial layer 61 has at least one region 60 free of overlap. The region 60 free of overlap is arranged between the second partial layer 62 and a section 40 of the first connection layer 4. A region 60 free of overlap is understood to mean in particular a region of the first partial layer 61 which overlaps neither the second partial layer 62 nor the first connection layer 4 in a plan view of the semiconductor body 2. The region 60 free of overlap is situated outside the at least one cutout 24 of the semiconductor body 2. In a plan view of the semiconductor body 2 the region 60 free of overlap completely surrounds the at least one cutout 24. In other words, the region 60 free of overlap extends fully circumferentially around the at least one cutout.

The connection layer 4 can have a plurality of sections 40, wherein the sections 40 are in each case spaced apart from one another laterally. That is to say that in a plan view of the semiconductor body 2 the sections 40 are free of overlap. The semiconductor body 2 has a plurality of cutouts 24, wherein each cutout 24 is assigned to a corresponding section 40 of the first connection layer 4. In a plan view of the semiconductor body each cutout 24 is completely covered by a section 40 corresponding to the cutout. Outside the cutout 24, the section 40 regionally overlaps the first partial layer 61 of the second connection layer 6.

The sections 40 overlap the first partial layer 61, such that the semiconductor body 2 in plan view is completely covered by the first connection layer 4 and the first partial layer 61 of the second connection layer 6. In particular, the first partial layer 61 and the first connection layer 4 are embodied in each case as a mirror layer for the radiation emitted by the active region 2. By way of example, the first partial layer 61 and the first connection layer 4 reflect in each case at least 80%, preferably at least 90%, and particularly preferably at least 95%, of a visible portion of the radiation generated by the active region. Preferably, the first connection layer 4 contains silver or aluminum. Furthermore, the first connection layer 4 can contain a silver alloy or an aluminum alloy. For example, the first connection layer 4 is an electrically conductive metal layer embodied as highly reflective. A complete covering of the semiconductor body 2 regionally by the first partial layer 61 and regionally by the first connection layer 4, wherein the first partial layer and the first connection layer are embodied as reflective, has the effect that the radiation generated by the active region is reflected back in the direction of the second main surface 202 of the semiconductor body 2, as a result of which the coupling-out efficiency of the optoelectronic component is increased.

In the vertical direction, the first connection layer 4 has a first layer thickness D1. The second partial layer 62 has a second layer thickness D2. In FIG. 2, the first layer thickness D1 and the second layer thickness D2 are substantially identical.

In particular, the first partial layer 61, the second partial layer 62, the insulation layer 5 and the first connection layer are deposited onto the semiconductor body 2. These layers here can have in each case a layer thickness which is substantially constant along the lateral direction. The first connection layer 4 and the insulation layer 5 each have a maximum vertical elevation, wherein the maximum elevations are at a substantially identical vertical level. In particular, the first connection layer 4 and the insulation layer 5 have a substantially identical maximum vertical elevation in the regions in which the semiconductor body 2 is covered by the first partial layer 61. This has the effect that the first connection layer 4 and the insulation layer 5 in particular outside the cutouts 24 form a surface with reduced topography differences. A connecting layer 3 can be applied to said surface during production, wherein the semiconductor body 2 is mechanically stably connected to a carrier 1 of the optoelectronic component by means of the connecting layer 3. Applying the connecting layer 3 to a surface with reduced topography differences reduces the consumption of material of the connecting layer 3. Furthermore, on account of the reduced topography differences, instead of gold or platinum it is possible to use other more cost-effective metals having comparatively smaller, but sufficient filling depths, for instance nickel, tin or indium. The connecting layer 3 is in particular an Sn-based solder layer.

In FIG. 2, a trench 43 is formed between the insulation layer 5 and the section 40 of the first connection layer 4. The trench 43 thus forms a boundary region between the insulation layer 5 and a section 40 of the first connection layer. In the region of the semiconductor body 2, the trench 43 in plan view completely overlaps the first partial layer 61, in particular the region 60 free of overlap of the first partial layer 61. That is to say that the trench 43 in the region of the semiconductor body has no location which does not overlap the first partial layer 61, in particular the region 60 free of overlap. In a plan view of the semiconductor body 2 the trench 43 extends fully circumferentially around the section 40 of the first connection layer 4.

The trench 43 is completely filled by a material of the connecting layer 3. A complete filling of the trench 43 increases the mechanical stability between the carrier 1 and the semiconductor body 2. The trench 43 has a vertical depth T. The vertical depth T of the trench is determined by the first layer thickness D1 of the first connection layer 4. In other words, the vertical depth T is of exactly the same magnitude as the first layer thickness D1. By way of example, the depth T of the trench 43 is greater than or equal to 200 nm. Preferably, the depth of the trench 43 is less than or equal to 700 nm. Trenches having such depths, even in the case of small cross sections, can be filled by materials which are more cost-effective in comparison with gold or platinum, such as nickel-tin (NiSn) or indium-tin (InSn), at a temperature of up to at most 350° C. It is thus possible to avoid damage to the first partial layer 61 comprising silver, for instance, at a higher filling temperature, for instance in the case of gold or platinum as solder material. In the case of Sn-based solder systems, a main reactant is nickel, in particular, and not platinum or gold. The trench 43 having a vertical depth T of, for example, up to and including 700 nm can be filled with an Sn-based solder layer even already when there is a relatively low noble metal content. By way of example, the connecting layer 3 is low in platinum, in particular free of platinum, such that, for singulating optoelectronic components, plasma separation processes can be employed as more cost-effective alternatives to costly laser separation processes.

In the at least one cutout 24, a contact element 7 is arranged between the semiconductor body 2 and the first connection layer 4. The contact element 7 is embodied with a height such that the first connection layer arranged on the contact element 7 within the cutout 24 has a maximum elevation that is substantially equal to the maximum vertical elevation of the first connection layer 4 outside the cutout 24. Such a configuration of the contact element 7 reduces the topography differences of the surface of the first connection layer within and outside the cutout 24. This has the effect, in particular, that the consumption of material of the connecting layer 3 is furthermore reduced.

The contact element 7 has an adhesion layer 71 and a filling layer 72. The adhesion layer 71 is arranged between the filling layer 72 and the semiconductor body 2. The contact element is embodied in an electrically conductive fashion. The connecting layer 3 and the carrier 1 can likewise be embodied in an electrically conductive fashion, such that the second semiconductor layer 22 of the semiconductor body 2 can be contact-connected to an external voltage source at the rear side by means of the first contact layer 101. The adhesion layer 71 comprises in particular an electrically conductive material which adheres to the second semiconductor layer 22 sufficiently well and forms an electrical contact therewith. The adhesion layer 71 can be a metal layer. Furthermore, the adhesion layer 71 can comprise a TCO material (Transparent Conductive Oxide). The filling layer 72 is for example a TCO layer, for instance a zinc oxide layer. The adhesion layer 71 and the filling layer can be doped. In FIG. 2, the contact element projects in the vertical direction toward the first connection layer beyond the first partial layer 61 approximately by a layer thickness of the insulation layer 5.

It has been found that a filling volume in the region of the section 40 and of the trench 43 of the present invention can be reduced to one third of a starting volume in comparison with a conventional component. In particular, for this purpose, the layer thicknesses of the first connection layer 4 and of the contact element 7 are adapted to the layer thicknesses of the compensation layer 62 and the insulation layer 5, wherein the first connection layer 4 and the insulation layer 5 have a substantially identical maximum vertical elevation from the second main surface 202 of the semiconductor body 2.

Figure 3:
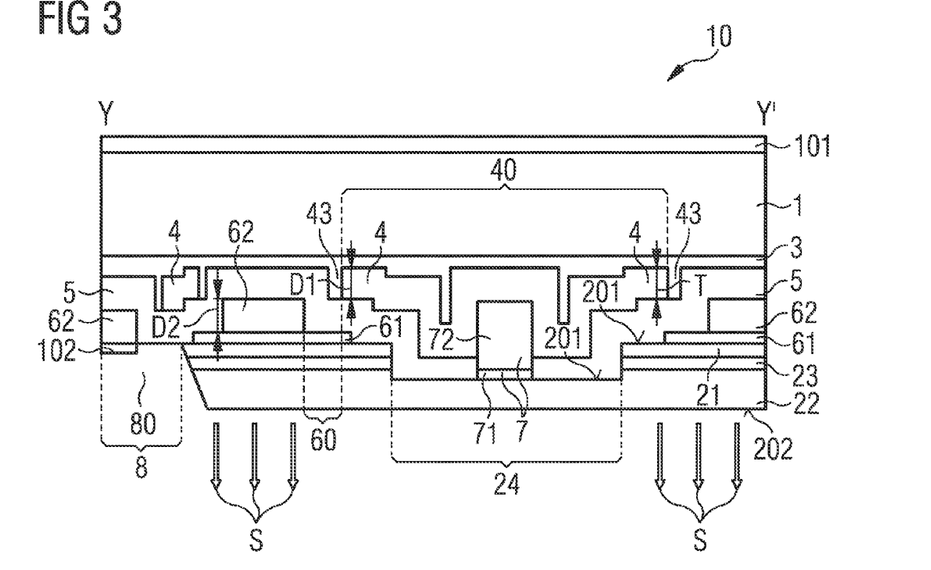
FIG. 3 shows a further excerpt from an optoelectronic component in accordance with one exemplary embodiment in schematic sectional view.

FIG. 3 schematically illustrates a further excerpt from an optoelectronic component in sectional view. In particular, a region identified by the line YY' illustrated in FIG. 1 is described.

The component comprises an edge region 8 arranged laterally with respect to the semiconductor body 2. In the edge region 8, the component 10 has a lateral opening 80, wherein a side surface of the semiconductor body 2 forms an inner wall of the opening. The side surface is formed obliquely relative to the second main surface 202 of the semiconductor body. A cross section of the opening decreases with increasing distance from the second main surface 202 in the direction of the carrier 1.

In the edge region 8, the second partial layer 62 of the second connection layer 6, the insulation layer 5 and the first connection layer 4 are arranged on a carrier 1. In a plan view of the carrier 1 the opening 80 overlaps both the second partial layer 62 and the insulation layer 5 and the first connection layer 4 regionally. A bottom surface of the opening is formed regionally by the insulation layer 5. The formation of the second partial layer 62, of the insulation layer 5 and of the first connection layer 4 in the edge region, wherein the second partial layer 62 and the first connection layer 4 have an approximately identical layer thickness, reduces the topographical differences and thus the layer thickness of the connecting layer 3 in the edge region 8.

A second contact layer 102 for making electrical contact with the first semiconductor layer 21 is applied to the second partial layer 62 in the edge region 8. The second partial layer 62 of the component is embodied in a continuous fashion. Electrical contact can be made with the second semiconductor layer 22 of the semiconductor body 2 externally by means of the first connection layer 4, the connecting layer 3, the carrier 1 and the first contact layer 101. Electrical contact can thus be made with the component externally by means of the first contact layer 101 and the second contact layer 102. In a departure therefrom, electrical contact can be made with the first semiconductor layer 21 externally directly by means of the second partial layer 62. It is therefore also conceivable that the second contact layer 102 can be dispensed with.

By means of a targeted adaptation with regard to the layer thicknesses of the layers of a component, in particular with regard to the relative layer thicknesses of a first connection layer and of a second connection layer, topographical differences of an interface which faces a connecting layer can be reduced, such that a consumption of connecting material is reduced. Furthermore, cost-effective connecting materials, in particular soldering materials, can be used on account of the reduced topographical differences.

This patent application claims the priority of German patent application 102013111918, the disclosure content of which is hereby incorporated by reference.

The invention is not restricted to the exemplary embodiments by the description of the invention on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

What is claimed is:

1. An optoelectronic component comprising a semiconductor body, a first connection layer, an insulation layer and a second connection layer, wherein the semiconductor body has an active region for generating electromagnetic radiation and the second connection layer comprises a first partial layer and a second partial layer, wherein
the insulation layer electrically insulates the first connection layer from the second connection layer,
the first partial layer is arranged between the second partial layer and the semiconductor body in a vertical direction,
in a plan view of the semiconductor body the first connection layer overlaps the first partial layer and is spaced apart from the second partial layer in a lateral direction,
the first connection layer has a first layer thickness and the second partial layer has a second layer thickness, wherein the first layer thickness and the second layer thickness differ from one another at most by 20%,
the first connection layer and the insulation layer have a substantially identical maximum vertical elevation in the regions in which the semiconductor body is covered by the first partial layer, so that the first connection layer and the insulation layer form a surface being remote from the semiconductor body and having reduced topography differences.

2. The optoelectronic component according to claim 1, wherein the semiconductor body, the first connection layer and the insulation layer are mechanically stably connected to a carrier of the component by means of a connecting layer, wherein the connecting layer is arranged regionally between the carrier and the insulation layer and regionally between the carrier and the first connection layer.

3. The optoelectronic component according to claim 2, wherein the connecting layer is embodied in a continuous fashion and only adjoins the carrier, the connection layer and the insulation layer.

4. The optoelectronic component according to claim 1, wherein the first connection layer has at least one section and a trench is formed between the insulation layer and the at least one section of the first connection layer in a lateral direction,
wherein in a plan view of the semiconductor body the trench completely overlaps the first partial layer.

5. The optoelectronic component according to claim 4, wherein
in a plan view of the semiconductor body the trench extends fully circumferentially around the at least one section in a lateral direction.

6. The optoelectronic component according to claim 4, wherein
the trench has a vertical depth, which is of the same magnitude as the first layer thickness of the first connection layer, wherein the first layer thickness is greater than or equal to 200 nm and less than or equal to 700 nm.

7. The optoelectronic component according to claim 4, wherein
the trench is completely filled with a connecting material.

8. The optoelectronic component according to claim 1, wherein
the semiconductor body has a first semiconductor layer, a second semiconductor layer and at least one cutout, wherein
the active region is arranged between the first semiconductor layer and the second semiconductor layer, and
the at least one cutout extends through the first semiconductor layer and the active region into the second semiconductor layer.

9. The optoelectronic component according to claim 8, wherein
the insulation layer extends in the vertical direction regionally into the at least one cutout and adjoins a contact element in the cutout, wherein
the contact element is arranged in the cutout between the semiconductor body and the first connection layer, and
the contact element is embodied with a height such that the first connection layer outside the cutout and the first connection layer arranged on the contact element within the cutout have an identical maximum elevation from a second main surface of the semiconductor body.

10. The optoelectronic component according to claim 8, wherein
the at least one cutout is assigned to a corresponding section of the first connection layer, wherein in a plan view of the semiconductor body the corresponding section of the first connection layer is completely enclosed by the second partial layer.

11. The optoelectronic component according to claim 10, wherein
in a plan view of the semiconductor body the corresponding section completely covers the at least one cutout and regionally overlaps the first partial layer outside the at least one cutout.

12. The optoelectronic component according to claim 1, wherein
the first partial layer and the first connection layer are embodied as mirror layers for the electromagnetic radiation generated by the active region.

13. The optoelectronic component according to claim 1, wherein
the semiconductor body has a plurality of cutouts, wherein the cutouts in each case extend through the active region, the second connection layer is embodied in a continuous fashion,
the first connection layer has a plurality of laterally spaced-apart sections each assigned to one of the cutouts.

14. The optoelectronic component according to claim 1, wherein
a lateral opening is formed in an edge region of the component and the second partial layer, the insulation layer and the first connection layer are arranged between a bottom surface of the opening and a carrier of the component.

15. The optoelectronic component according to claim 1, wherein
the first connection layer, the insulation layer, the first partial layer and the second partial layer in each case have a constant layer thickness.

16. An optoelectronic component comprising a semiconductor body, a first connection layer, an insulation layer and a second connection layer, wherein the semiconductor body has an active region for generating electromagnetic radiation and the second connection layer comprises a first partial layer and a second partial layer, wherein
the insulation layer electrically insulates the first connection layer from the second connection layer,
the first partial layer is arranged between the second partial layer and the semiconductor body in a vertical direction,
in a plan view of the semiconductor body the first connection layer overlaps the first partial layer and is spaced apart from the second partial layer in a lateral direction,
the first connection layer has a first layer thickness and the second partial layer has a second layer thickness, wherein the first layer thickness and the second layer thickness differ from one another at most by 20%,
the first connection layer has at least one section and a trench is formed between the insulation layer and the at least one section of the first connection layer in a lateral direction,
for fixing the semiconductor body to a carrier of the components the trench is filled with a connecting material of a connecting layer, and the trench has a vertical depth which is of the same magnitude as the first layer thickness of the first connection layer, wherein the first layer thickness is greater than or equal to 200 nm and less than or equal to 700 nm, and wherein the trench is completely filled with a connecting material.

17. The optoelectronic component according to claim 16, wherein
the first connection layer and the insulation layer are mechanically stably connected to the carrier of the component by means of the connecting layer, wherein the connecting layer is arranged regionally between the carrier and the insulation layer and regionally between the carrier and the first connection layer.

18. The optoelectronic component according to claim 16, wherein
in a plan view of the semiconductor body the trench completely overlaps the first partial layer and is completely filled with a connecting material.

19. The optoelectronic component according to claim 16, wherein
the first connection layer, the insulation layer, the first partial layer and the second partial layer in each case are coating layers and in each case have a constant layer thickness.

20. An optoelectronic component comprising a semiconductor body, a first connection layer, an insulation layer and a second connection layer, wherein the semiconductor body has an active region for generating electromagnetic radiation and the second connection layer comprises a first partial layer and a second partial layer, wherein
the insulation layer electrically insulates the first connection layer from the second connection layer,
the first partial layer is arranged between the second partial layer and the semiconductor body in a vertical direction,
in a plan view of the semiconductor body the first connection layer overlaps the first partial layer and is spaced apart from the second partial layer in a lateral direction,
the first connection layer has a first layer thickness and the second partial layer has a second layer thickness, wherein the first layer thickness and the second layer thickness differ from one another at most by 20%,
the semiconductor body has a first semiconductor layer, a second semiconductor layer and at least one cutout, wherein the active region is arranged between the first semiconductor layer and the second semiconductor layer, and the at least one cutout extends through the first semiconductor layer and the active region into the second semiconductor layer,
the insulation layer extends in the vertical direction regionally into the at least one cutout and adjoins a contact element in the cutout, wherein the contact element is arranged in the cutout between the semiconductor body and the first connection layer, and the contact element is embodied with a height such that the first connection layer outside the cutout and the first connection layer arranged on the contact element within the cutout have an identical maximum elevation from a second main surface of the semiconductor body,
the first connection layer, the insulation layer, the first partial layer and the second partial layer in each case have a substantially constant layer thickness, and
a layer has a substantially constant layer thickness when it has an identical vertical extent within the scope of the production tolerances, apart from regions in which the layer is shaped over underlying edges.

\* \* \* \* \*